US008018300B2

United States Patent
Chen et al.

(10) Patent No.: US 8,018,300 B2
(45) Date of Patent: Sep. 13, 2011

(54) BAND REJECTION FILTER CAPABLE OF REDUCING HARMONICS AND RELATED SATELLITE SIGNAL RECEIVER

(75) Inventors: Tzong-Jyh Chen, Taipei Hsien (TW); Chien-Heng Wu, Taipei Hsien (TW)

(73) Assignee: Wistron NeWeb Corporation, Hsi-Chih, Taipei Hsien (TW)

( * ) Notice: Subject to any disclaimer, the term of this patent is extended or adjusted under 35 U.S.C. 154(b) by 245 days.

(21) Appl. No.: 12/465,658

(22) Filed: May 14, 2009

(65) Prior Publication Data
US 2010/0064326 A1 Mar. 11, 2010

(30) Foreign Application Priority Data
Sep. 10, 2008 (TW) .............................. 97134685 A

(51) Int. Cl.
*H03H 7/01* (2006.01)
(52) U.S. Cl. .................. 333/176; 333/172; 333/185
(58) Field of Classification Search ................. 333/132, 333/172, 175, 176, 177, 185
See application file for complete search history.

(56) References Cited

U.S. PATENT DOCUMENTS

| | | | | |
|---|---|---|---|---|
| 3,585,553 A | * | 6/1971 | Muckelroy et al. | 336/192 |
| 7,592,882 B2 | * | 9/2009 | Shafer | 333/176 |
| 7,821,359 B2 | * | 10/2010 | Hart | 333/176 |

\* cited by examiner

*Primary Examiner* — Robert Pascal
*Assistant Examiner* — Kimberly Glenn
(74) *Attorney, Agent, or Firm* — Winston Hsu; Scott Margo

(57) ABSTRACT

A band rejection filter capable of reducing harmonics includes a first signal end, a second signal end, a high pass filter coupled between the first signal end and the second signal end for performing high pass filtering on signals transmitted between the first signal end and the second signal end, and a low pass filter coupled between the first signal end and the second signal end for performing low pass filtering on signals transmitted between the first signal end and the second signal end. The low pass filter includes a plurality of non-magnetic-core inductors coupled in a sequence between the first signal end and the second signal end, and a plurality of capacitors respectively coupled between an intersection of adjacent non-magnetic-core inductors of the plurality of non-magnetic-core inductors and a ground end.

13 Claims, 5 Drawing Sheets

BAND REJECTION FILTER CAPABLE OF REDUCING HARMONICS AND RELATED SATELLITE SIGNAL RECEIVER

BACKGROUND OF THE INVENTION

1. Field of the Invention

The present invention relates to a band rejection filter capable of reducing harmonics and related satellite signal receiver, and more particularly, to a band rejection filter and related satellite signal receiver capable of avoiding magnetic saturation generating non-linear harmonic interference signal, to ensure transmission quality.

2. Description of the Prior Art

A purpose of a filter is to pass signals in a certain frequency band, and reduce signals outside of the frequency band. The filter can be divided into four categories: a low pass filter, a high pass filter, a band pass filter, and a band rejection filter according to functions of the filters. Because the band rejection filter can filter out signals in a certain frequency band, it is often utilized in a communication system, such as a satellite signal receiver, which transmits signals via a low frequency band or a high frequency band.

Please refer to FIG. 1, which is a schematic diagram of a satellite signal receiver 10. The satellite signal receiver 10 is preferably a superheterodyne receiver, which includes an antenna 100, a frequency down converter 102, and a set-top box 104. A satellite signal is received by the antenna 100, lowered to an intermediate-frequency (IF) signal by the frequency down converter 102, and then processed by the set-top box 104. A signal path between the frequency down converter 102 and the set-top box 104 is formed by a cable 106. In other words, the cable 106 transmits a direct-current (DC) power (with frequency 0 MHz) provided by the set-top box 104 to the frequency down converter 102, signals (with frequency 2.3 MHz) used by a two-way frequency shift keying communication between the frequency down converter 102 and the set-top box 104, and an IF signal (with frequency from 250 to 2150 MHz) outputted from the frequency down converter 102 to the set-top box 104. Generally, the cable 106 can transmit the DC power and related signals effectively, to ensure the frequency down converter 102 and the set-top box 104 to function normally. However, in some cases, for example, if a plurality of the set-top boxes 104 connects to each other through a home network, the cable 106 may affect the transmission quality of the home network. The main reason is a DC converter, a crystal oscillator, and a frequency shift keying (FSK) modulator, etc in the frequency down converter 102 may leak signals out during operations. When leaked signals fall to a frequency band (from 4 to 100 MHz) of the home network, the communication quality of the home network will be affected. In this situation, a band rejection filter is added between the frequency down converter 102 and the set-top box 104 (namely on the cable 106), and a rejection frequency band of the band rejection filter is at least 4 to 100 MHz, to filter out the leaked signals which may influence the home network.

In the prior art, there are many methods to realize the band rejection filter. The most common method is to combine a high pass filter and a low pass filter. Please refer to FIG. 2A, which is a schematic diagram of a band rejection filter 20 utilized in the cable 106 shown in FIG. 1, and FIG. 2B, which is a schematic diagram of a frequency response diagram of the band rejection filter 20. As shown in FIG. 2A, the band rejection filter 20 includes a high pass filter 200 and a low pass filter 202. In addition, as shown in FIG. 2B, a highest rejection frequency $F_H$ of the high pass filter 200 needs to be larger than 100 MHz and smaller than 250 MHz, to filter high frequency leaked signals out and ensure that IF signals outputted from the frequency down converter 102 can be transmitted to the set-top box 104. A lowest rejection frequency $F_L$ of the low pass filter 202 needs to be larger than 2.3 MHz and smaller than 4 MHz, to filter out low frequency leaked signals and ensure the DC power and the two-way FSK signals transmitted normally. The low pass filter 202 is usually composed by inductors and capacitors, and the inductors are usually coil magnetic-core inductors because of cost and size issue. However, since a power standard of a 2.3 MHz FSK signal is −4 dBm, a high power signal causes inside of the magnetic-core magnetic saturated and generating non-linear effect when passing a coil magnetic-core inductor. Thus, harmonics corresponding to 2.3 MHz, such as 4.6 MHz, 6.9 MHz, 9.2 MH, etc signals, will be generated, and affect communication quality of the home network if the harmonics fall in 4 to 100 MHz frequency band of the home network.

SUMMARY OF THE INVENTION

Therefore, the present invention provides a band rejection filter capable of reducing harmonics and related satellite signal receiver.

The present invention discloses a band rejection filter capable of reducing harmonics, which includes a first signal end, a second signal end, a high pass filter coupled between the first signal end and the second signal end for performing high pass filtering on signals transmitted between the first signal end and the second signal end, and a low pass filter coupled between the first signal end and the second signal end for performing low pass filtering on signals transmitted between the first signal end and the second signal end. The low pass filter includes a plurality of non-magnetic-core inductors coupled in a sequence between the first signal end and the second signal end, and a plurality of capacitors respectively coupled between an intersection of adjacent non-magnetic-core inductors of the plurality of non-magnetic-core inductors and a ground end.

The present invention further discloses a satellite signal receiver which includes an antenna used for receiving a RF (Radio-Frequency) signal, a frequency down converter coupled to the antenna, and used for lowering a frequency of the RF signal to a preset frequency, to output an IF (intermediate-Frequency) signal, a set-top box (STB) used for processing the IF signal and controlling an operation of the frequency down converter, and a band rejection filter used for reducing harmonics. The band rejection filter includes a first signal end coupled to the frequency down converter, a second signal end coupled to the set-top box, a high pass filter coupled between the first signal end and the second signal end for performing high pass filtering on signals transmitted between the first signal end and the second signal end, and a low pass filter coupled between the first signal end and the second signal end for performing low pass filtering on signals transmitted between the first signal end and the second signal end. The low pass filter includes a plurality of non-magnetic-core inductors coupled in a sequence between the first signal end and the second signal end, and a plurality of capacitors respectively coupled between an intersection of adjacent non-magnetic-core inductors of the plurality of non-magnetic-core inductors and a ground end.

These and other objectives of the present invention will no doubt become obvious to those of ordinary skill in the art after

DETAILED DESCRIPTION

Figure 3:
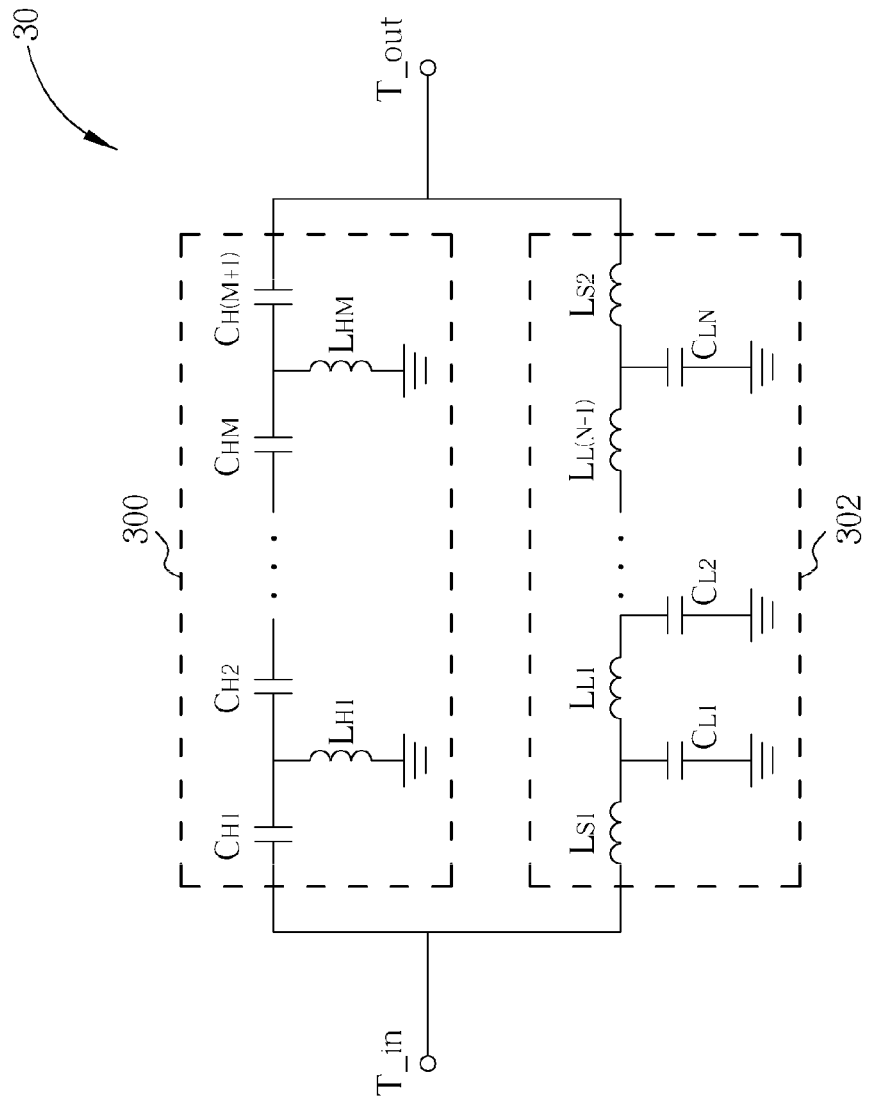
FIG. 3 is a schematic diagram of a band rejection filter according to an embodiment of the present invention.

Please refer to FIG. 3, which is a schematic diagram of a band rejection filter 30 according to an embodiment of the present invention. The band rejection filter 30 is preferably utilized in the satellite signal receiver 10 shown in FIG. 1, and is installed between the frequency down converter 102 and the set-top box 104, for reducing harmonics. The band rejection filter 30 includes signal ends T_in and T_out, a high pass filter 300, and a low pass filter 302. The high pass filter 300 includes capacitors $C_{H1}$~$C_{H(M+1)}$, and inductors $L_{H1}$~$L_{HM}$. The capacitors $C_{H1}$~$C_{H(M+1)}$ are coupled in a sequence between the signal ends T_in and T_out, and the inductors $L_{H1}$~$L_{HM}$ are respectively coupled between an intersection of adjacent capacitors of the capacitors $C_{H1}$~$C_{H(M+1)}$ and a ground end. The low pass filter 302 includes inductors $L_{S1}$, $L_{S2}$, and $L_{L1}$~$L_{L(N-1)}$, and capacitors $C_{L1}$~$C_{LN}$. The inductors $L_{S1}$, $L_{S2}$, and $L_{L1}$~$L_{L(N-1)}$ are coupled in a sequence between the signal ends T_in and T_out, and the capacitors $C_{L1}$~$C_{LN}$ are respectively coupled between an intersection of adjacent inductors of the inductors $L_{S1}$, $L_{S2}$, and $L_{L1}$~$L_{L(N-1)}$ and a ground end.

Note that, the inductors $L_{S1}$, $L_{S2}$, and $L_{L1}$~$L_{L(N-1)}$ are non-magnetic-core inductors, such as ceramic-core inductors or air-core inductors. In addition, inductances of the inductors $L_{S1}$ and the inductors $L_{S2}$ are equivalent (nH level), and smaller than the inductors $L_{L1}$~$L_{L(N-1)}$ (uH level). In other words, the inductances of the inductors $L_{S1}$ and $L_{S2}$ coupled to the signal ends T_in and T_out are smaller, which can pass a 2.3 MHz low frequency signal, but stop 250 to 2150 MHz high frequency signal, so as to isolate the inductors $L_{L1}$~$L_{L(N-1)}$ from influencing the IF signal. Therefore, the low pass filter 302 can reduce an effect to the IF signal, and maintain a low insertion loss response of the band rejection filter 30 in an IF band.

Figures 2A, 2B:
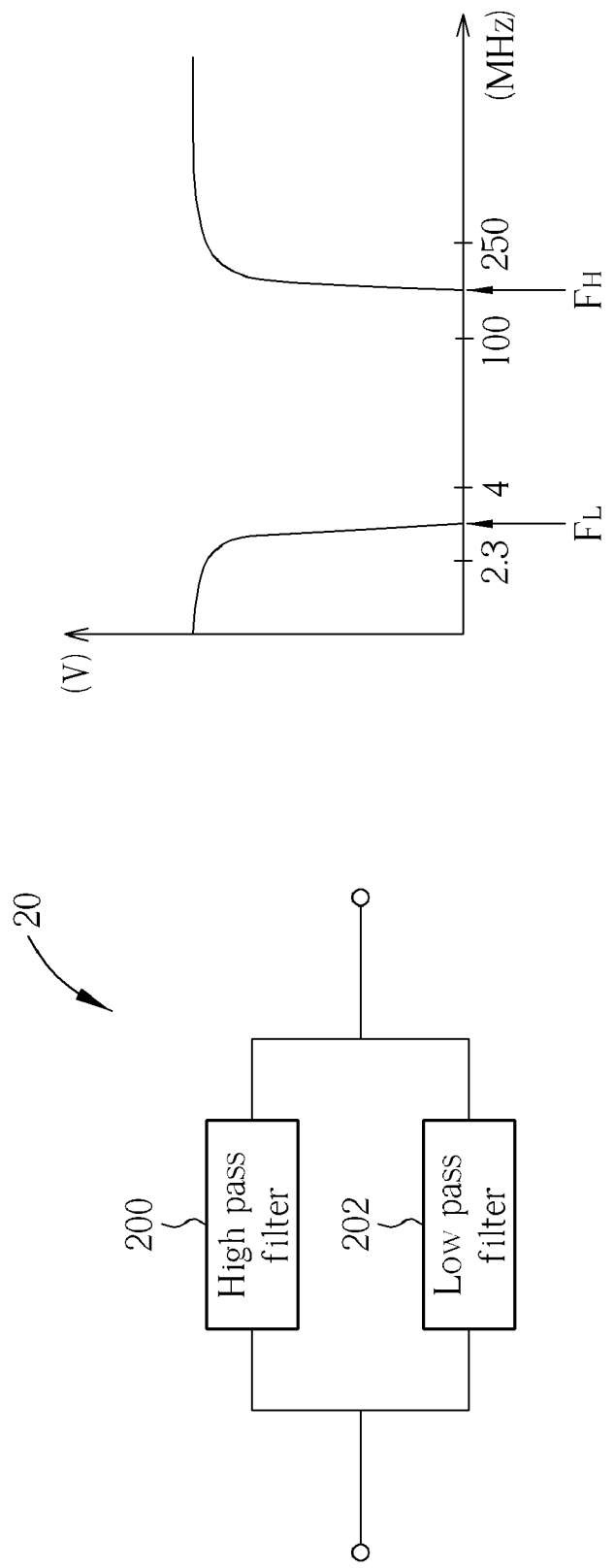
FIG. 2A is a schematic diagram of a band rejection filter utilized in a cable shown in FIG. 1.
FIG. 2B is a schematic diagram of a frequency response diagram of a band rejection filter shown in FIG. 2A.
Figure 4:
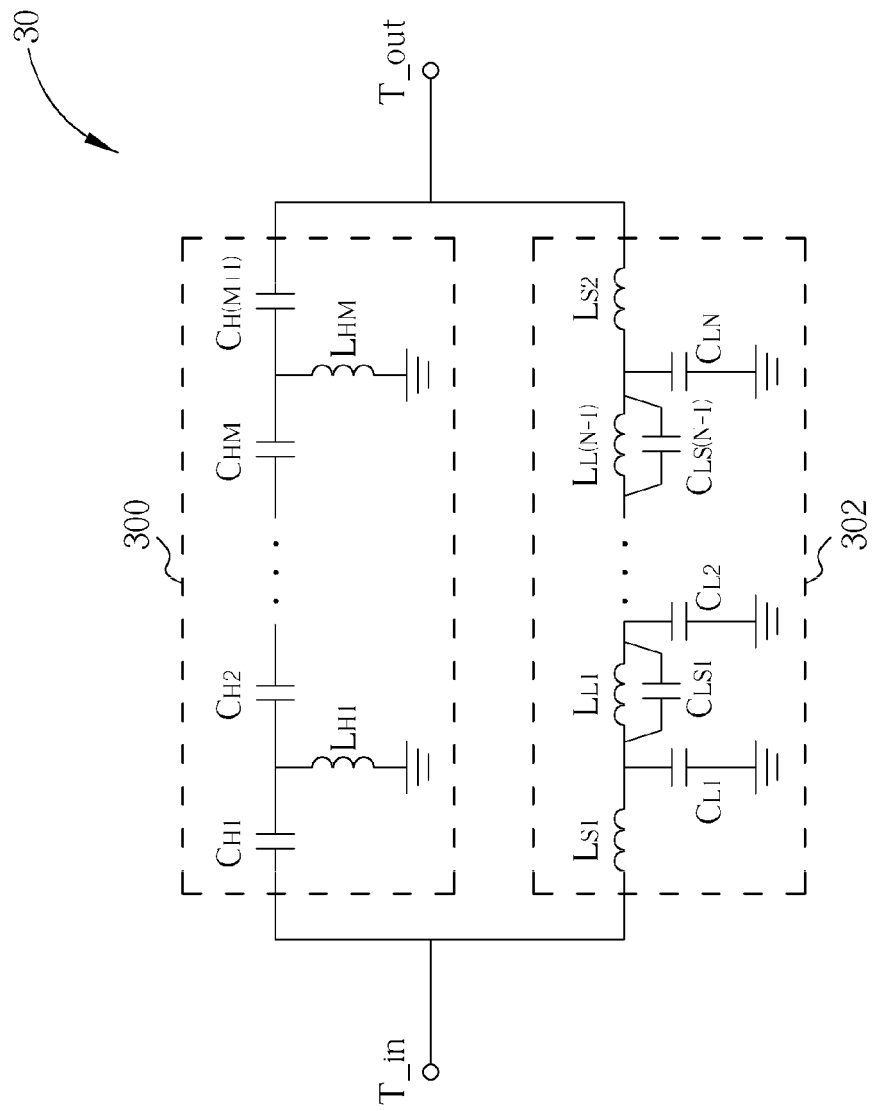
FIG. 4 is a schematic diagram of a band rejection filter according to an embodiment of the present invention.

In addition, in order to enhance efficiency of the low pass filter 302 and "sharpen" frequency responses of the low pass filter 302, the present invention couples the capacitors $C_{Ls1}$~$C_{Ls(N-1)}$ with the inductors $L_{L1}$~$L_{L(N-1)}$ in parallel as shown in FIG. 4. Therefore, the low pass filter 302 can enhance (as shown in FIG. 2) a rejection frequency effect of the lowest rejection frequency $F_L$ through assistance of the capacitors $C_{Ls1}$~$C_{Ls(N-1)}$, so as to enhance an efficiency of the band rejection filter 30.

Figure 1:
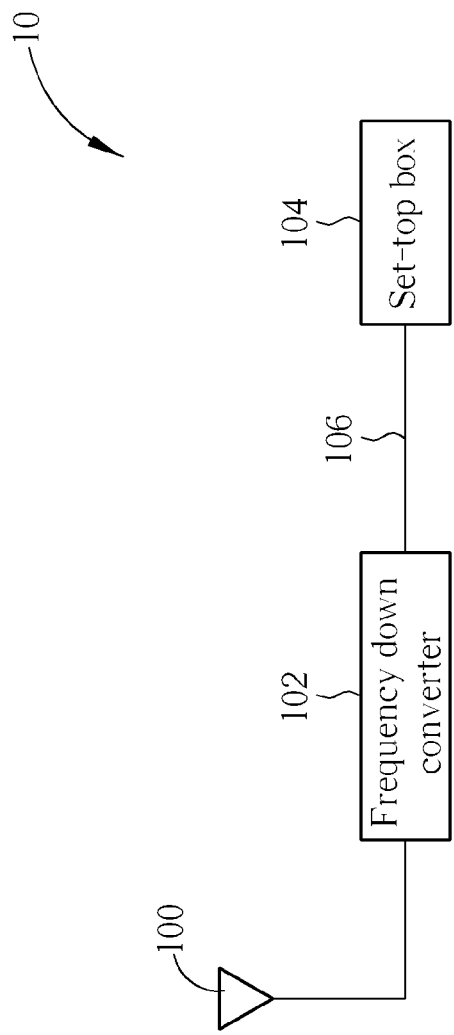
FIG. 1 is a schematic diagram of a satellite signal receiver.
Figure 5:
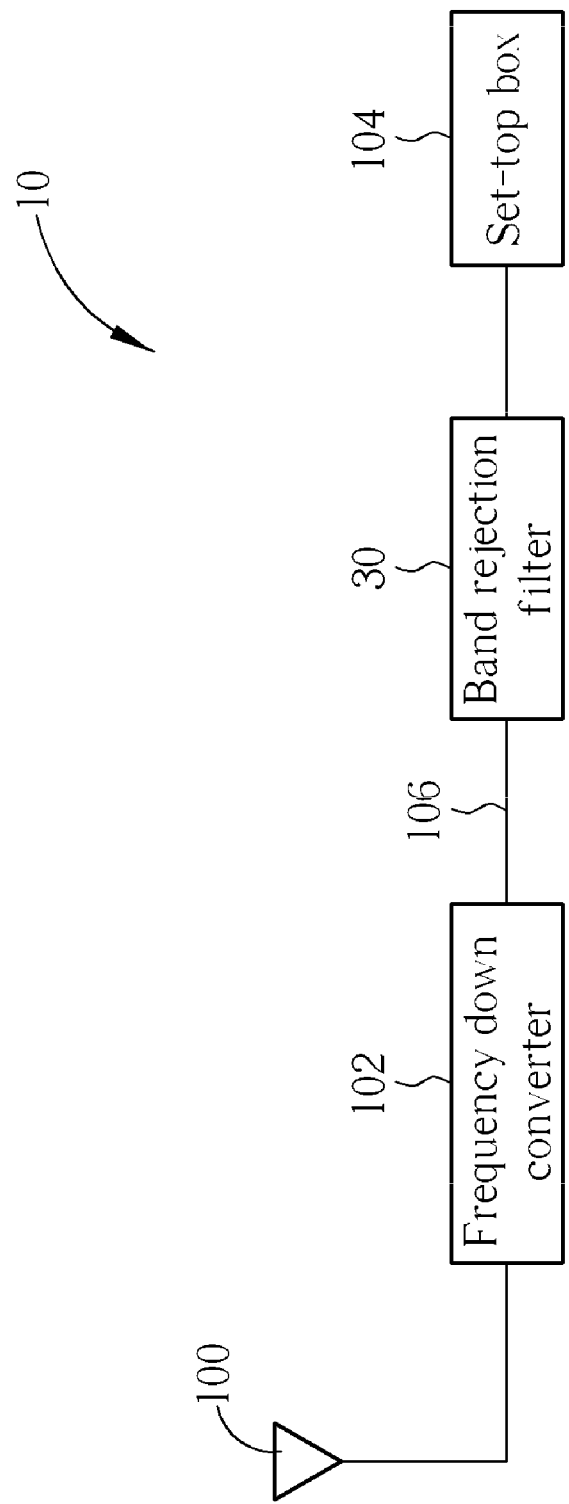
FIG. 5 is a schematic diagram of a band rejection filter utilized in a satellite signal receiver shown in FIG. 1.

Please refer to FIG. 5, which is a schematic diagram of the band rejection filter 30 utilized in the satellite signal receiver 10 shown in FIG. 1. The band rejection filter 30 is installed between the frequency down converter 102 and the set-top box 104 (namely on the cable 106). A description of operations of the antenna 100, the frequency down converter 102 and the set-top box 104 can be referred from the previous description, so the detailed description is omitted herein. In FIG. 5, the band rejection filter 30 can filter out the signals from 4 to 100 MHz, to avoid influence on communication quality of the home network. Meanwhile, the low pass filter 302 utilizes non-magnetic-core inductors, to avoid magnetic saturation generating nonlinear harmonic interference signal, so as to ensure transmission quality of the home network. In addition, in the low pass filter 302, the inductances of the inductors $L_{S1}$ and $L_{S2}$ are smaller, which can pass the 2.3 MHz low frequency signal, to isolate the inductors $L_{L1}$~$L_{L(N-1)}$ from influencing the IF signal, so as to maintain the low insertion loss of the band rejection filter 30 in the IF band. Certainly, as shown in FIG. 4, efficiency of the low pass filter 302 is enhanced by increasing the capacitor $C_{LS1}$~$C_{LS(N-1)}$.

In conclusion, the low pass filter of the band rejection filter in the present invention utilizes non-magnetic-core inductors, which can avoid magnetic saturation generating non-linear harmonic interference signal, to ensure transmission quality. Therefore, the satellite signal receiver can ensure communication quality of the home network via the band rejection filter of the present invention.

Those skilled in the art will readily observe that numerous modifications and alterations of the device and method may be made while retaining the teachings of the invention.

What is claimed is:

1. A band rejection filter capable of reducing harmonics comprising:
    a first signal end;
    a second signal end;
    a high pass filter, coupled between the first signal end and the second signal end, for performing high pass filtering on signals transmitted between the first signal end and the second signal end; and
    a low pass filter, coupled between the first signal end and the second signal end, for performing low pass filtering on signals transmitted between the first signal end and the second signal end, comprising:
        a plurality of non-magnetic-core inductors, coupled in a sequence between the first signal end and the second signal end; and
        a plurality of capacitors, respectively coupled between an intersection of adjacent non-magnetic-core inductors of the plurality of non-magnetic-core inductors and a ground end;
        wherein inductances of a first non-magnetic-core inductor of the plurality of non-magnetic-core inductors coupled to the first end and a second non-magnetic-core inductor of the plurality of non-magnetic-core inductors coupled to the second signal end are smaller than inductances of other non-magnetic-core inductors of the plurality of non-magnetic-core inductors.

2. The band rejection filter of claim 1, wherein the inductances of the first non-magnetic-core inductor and the second non-magnetic-core inductor are equivalent.

3. The band rejection filter of claim 1, wherein the low pass filter further comprises:
    a plurality of capacitors, each coupled to a non-magnetic-core inductor of the plurality of non-magnetic-core inductors other than the first non-magnetic-core inductor or the second non-magnetic-core inductor in parallel.

4. The band rejection filter of claim 1, wherein the plurality of non-magnetic-core inductors are ceramic-core inductors.

5. The band rejection filter of claim 1, wherein the plurality of non-magnetic-core inductors are air-core inductors.

6. The band rejection filter of claim 1, wherein the high pass filter comprises:
   a plurality of capacitors, coupled in a sequence between the first signal end and the second signal end; and
   a plurality of inductors, coupled between an intersection of adjacent capacitors of the plurality of capacitors and the ground end.

7. The band rejection filter of claim 1, being utilized between a mixer and a set-top box of a satellite signal receiver.

8. A satellite signal receiver comprising:
   an antenna, for receiving a satellite signal;
   a frequency down converter, coupled to the antenna, for lowering a frequency of the satellite signal received by the antenna, to output an intermediate-frequency (IF) signal;
   a set-top box (STB), for processing the IF signal and controlling an operation of the frequency down converter; and
   a band rejection filter, for reducing harmonics, comprising:
      a first signal end, coupled to the frequency down converter;
      a second signal end, coupled to the set-top box;
      a high pass filter, coupled between the first signal end and the second signal end, for performing high pass filtering on signals transmitted between the first signal end and the second signal end; and
      a low pass filter, coupled between the first signal end and the second signal end, for performing low pass filtering on signals transmitted between the first signal end and the second signal end, comprising:
         a plurality of non-magnetic-core inductors, coupled in a sequence between the first signal end and the second signal end; and
         a plurality of capacitors, respectively coupled between an intersection of adjacent non-magnetic-core inductors of the plurality of non-magnetic-core inductors and a ground end;
      wherein inductances of a first non-magnetic-core inductor of the plurality of non-magnetic-core inductors coupled to the first end and a second non-magnetic-core inductor of the plurality of non-magnetic-core inductors coupled to the second signal end are smaller than inductances of other non-magnetic-core inductors of the plurality of non-magnetic-core inductors.

9. The satellite signal receiver of claim 8, wherein the inductances of the first non-magnetic-core inductor and the second non-magnetic-core inductor are equivalent.

10. The satellite signal receiver of claim 8, wherein the low pass filter further comprises:
    a plurality of capacitors, each coupled to a non-magnetic-core inductor of the plurality of non-magnetic-core inductors other than the first non-magnetic-core inductor or the second non-magnetic-core inductor in parallel.

11. The satellite signal receiver of claim 8, wherein the plurality of non-magnetic-core inductors are ceramic-core inductors.

12. The satellite signal receiver of claim 8, wherein the plurality of non-magnetic-core inductors are air-core inductors.

13. The satellite signal receiver of claim 8, wherein the high pass filter comprises:
    a plurality of capacitors, coupled in a sequence between the first signal end and the second signal end; and
    a plurality of inductors, coupled between an intersection of adjacent capacitors of the plurality of capacitors and the ground end.

* * * * *